United States Patent
Lee et al.

(10) Patent No.: US 10,790,179 B2
(45) Date of Patent: Sep. 29, 2020

(54) ALIGNMENT APPARATUS

(71) Applicant: SEMIgear, Inc., Wakefield, MA (US)

(72) Inventors: Seockhwi Lee, Hwaseong-si (KR); Wonchang Choi, Namyangju-si (KR)

(73) Assignee: SEMIgear, Inc., Wakefield, MA (US)

( * ) Notice: Subject to any disclaimer, the term of this patent is extended or adjusted under 35 U.S.C. 154(b) by 0 days.

(21) Appl. No.: 16/387,505

(22) Filed: Apr. 17, 2019

(65) Prior Publication Data
US 2019/0378738 A1    Dec. 12, 2019

(30) Foreign Application Priority Data
Jun. 12, 2018 (KR) .......................... 10-2018-0067703

(51) Int. Cl.
| | |
|---|---|
| B25B 5/14 | (2006.01) |
| H01L 21/68 | (2006.01) |
| H01L 21/687 | (2006.01) |
| H01L 21/67 | (2006.01) |

(52) U.S. Cl.
CPC ........ H01L 21/68 (2013.01); H01L 21/67259 (2013.01); H01L 21/68735 (2013.01); H01L 21/68764 (2013.01); *Y10S 414/136* (2013.01)

(58) Field of Classification Search
CPC ............. Y10S 414/136; Y10S 414/141; H01L 21/68728; H01L 21/68; H01L 21/681; H01L 21/682; H01L 2223/54493
See application file for complete search history.

(56) References Cited

U.S. PATENT DOCUMENTS

| | | | | |
|---|---|---|---|---|
| 4,313,266 A | * | 2/1982 | Tam ........................ | C30B 33/00 34/317 |
| 4,655,584 A | * | 4/1987 | Tanaka .................. | G03F 7/7075 355/53 |
| 4,685,206 A | * | 8/1987 | Kobayashi ............ | B23P 19/002 198/394 |
| 4,902,900 A | | 2/1990 | Kamiya et al. | |
| 5,031,547 A | * | 7/1991 | Hirose ................. | B23Q 1/4866 108/137 |
| 5,851,041 A | * | 12/1998 | Anderson ................. | B25B 5/06 294/106 |
| 6,051,845 A | * | 4/2000 | Uritsky ............. | H01L 21/67282 250/559.3 |

(Continued)

FOREIGN PATENT DOCUMENTS

| | | | |
|---|---|---|---|
| JP | 10209249 A | * | 8/1998 |
| JP | H10-209249 A | | 8/1998 |

(Continued)

*Primary Examiner* — Gregory W Adams
(74) *Attorney, Agent, or Firm* — Park, Kim & Suh, LLC

(57) ABSTRACT

Disclosed is an alignment apparatus that aligns a treatment object having a notch. The alignment apparatus includes a support member on which the treatment object is positioned, a driving unit configured to rotate the support member, a pushing member configured to move the treatment object to a proper location on the support member by applying a force to a side surface of the treatment object positioned on the support member, a notch detecting unit configured to detect whether the notch of the treatment object is located at a specific location, and a controller configured to control the driving unit such that the notch of the treatment object is located at the specific location by rotating the support member.

15 Claims, 8 Drawing Sheets

(56) References Cited

U.S. PATENT DOCUMENTS

| | | | | |
|---|---|---|---|---|
| 7,547,181 | B2* | 6/2009 | Fukatsu | ................ H01L 21/68 |
| | | | | 414/757 |
| 7,789,614 | B2* | 9/2010 | Yoshino | ............ H01L 21/67259 |
| | | | | 118/730 |
| 7,918,640 | B2* | 4/2011 | Fujii | ................ H01L 21/67184 |
| | | | | 414/217 |
| 8,863,808 | B2* | 10/2014 | Yuki | ................ H01L 21/67092 |
| | | | | 156/580 |
| 9,082,799 | B2* | 7/2015 | Weaver | ................ C23C 14/042 |
| 9,324,602 | B2* | 4/2016 | Shinohara | ......... H01L 21/67781 |
| 2012/0257952 | A1 | 10/2012 | Palm et al. | |
| 2017/0010092 | A1* | 1/2017 | Zell | ........................ G01B 11/27 |

FOREIGN PATENT DOCUMENTS

| | | |
|---|---|---|
| JP | 2005203726 A * | 7/2005 |
| JP | 3757430 B2 | 3/2006 |
| KR | 10-2007-0007946 A | 1/2007 |
| KR | 10-2007-0044717 A | 4/2007 |
| KR | 10-1613135 B1 | 4/2016 |
| KR | 10-1811681 B1 | 12/2017 |
| TW | 201034113 A | 9/2010 |
| TW | 201438134 A | 10/2014 |
| TW | 201737377 A | 10/2017 |
| TW | 201738950 A | 11/2017 |
| TW | 201740444 A | 11/2017 |
| WO | 2018/101025 A1 | 6/2018 |

* cited by examiner

ALIGNMENT APPARATUS

CROSS-REFERENCE TO RELATED APPLICATIONS

The present application claims the benefit of Korean Patent Application No. 10-2018-0067703 filed on Jun. 12, 2018, in the Korean Intellectual Property Office, the entire contents of which are hereby incorporated by reference.

BACKGROUND

Embodiments of the inventive concept described herein relate to an alignment apparatus that aligns a treatment object including a substrate, such as a semiconductor wafer.

In general, in a semiconductor manufacturing process, a semiconductor wafer has to be aligned in a specific direction necessarily when the semiconductor wafer is carried to a specific location. This is because it is regarded that the crystals of the semiconductor wafer are grown in a specific direction and the wafer is arranged regularly for crystal growth directions for the manufacturing processes. Accordingly, in the semiconductor wafer manufacturing process, an operation of arranging the semiconductor wafer is essentially performed.

In recent years, as the surface structures of the semiconductor devices, such as semiconductor wafer, photo masks, and LCDs, have been highly integrated, the patterns used for them have become finer and the separation of the treatment objects from proper locations during the alignments of the treatment objects, such as wafers, may cause damage to the treatment objects.

Accordingly, the treatment objects, such as the semiconductor wafers, are required to be aligned more precisely and more stably.

SUMMARY

Embodiments of the inventive concept provide an alignment apparatus that may align a treatment object precisely.

Embodiments of the inventive concept provide an alignment apparatus that may align a treatment object stably.

The problems that are to be solved by the inventive concept are not limited to the above-mentioned problems, and the unmentioned problems will be clearly understood by those skilled in the art to which the inventive concept pertains from the specification and the accompanying drawings.

The inventive concept provides an alignment apparatus for align a treatment object having a notch. The alignment apparatus includes a support member on which the treatment object is positioned, a driving unit configured to rotate the support member, a pushing member configured to move the treatment object to a proper location on the support member by applying a force to a side surface of the treatment object positioned on the support member, a notch detecting unit configured to detect whether the notch of the treatment object is located at a specific location, and a controller configured to control the driving unit such that the notch of the treatment object is located at the specific location by rotating the support member.

The pushing member may include a rotary member provided to be movable between a first location and a second location and having a rotational body shape that is rotatable about a vertical rotary shaft, the first location may be a location at which a side surface of the rotary member contacts a side surface of the treatment object located at a proper location on the support member, and the second location may be a location at which a side surface of the rotary member is spaced apart from a side surface of the treatment object located at a proper location on the support member by a specific distance.

The pushing member further includes a rotation support part, to one end of which the rotary member is coupled and which is provided to be rotatable about an opposite end thereof along a horizontal direction.

A plurality of pushing members may be spaced apart from each other to surround the support member.

The controller may control the driving unit such that the notch of the treatment object is located at the specific location by rotating the support member in a state in which the pushing member is located at the first location.

The alignment apparatus may further include a height detecting unit configured to detect whether a partial area of the treatment object is located at a height or more from an upper surface of the support member.

The height detecting unit may include a laser sensor, the laser sensor may include a light emitting unit configured to emit a laser beam, and a light receiving unit configured to receive the laser beam emitted from the light emitting unit, and the light emitting unit and the light receiving unit may be provided on opposite sides of the support member.

The laser sensor may include a first laser sensor and a second laser sensor provided such that the laser beams emitted from the light emitting units cross each other on the support member, when viewed from the top.

The treatment object may include a frame ring, a mounting tape fixed to an inner surface of the frame ring, and a wafer attached to an upper surface of the mounting tape.

A plurality of notches may be provided along a circumference of the treatment object, and the notch detecting units may be provided to correspond to the notches.

The notch detecting unit may be a laser sensor provided such that a laser beam passes through the notch upwards and downwards.

An edge that may be cutaway such that the gap between the notches is linear when viewed from the top is formed on a side surface of the frame ring, when viewed from the top, and the alignment apparatus may further include an edge detecting unit configured to detect whether the edge is located at a specific location.

The edge detecting unit may be a laser sensor provided such that a laser beam passes by a specific location that is spaced apart from the edge by less than a specific distance.

The alignment apparatus may further include a rotation driving unit configured to rotate the pushing member, the pushing member may include a first pushing member and a second pushing member that are adjacent to each other such that the opposite ends of the first pushing member and the second pushing member face each other, the rotation driving unit may include a first air cylinder configured to linear move the piston toward a space between the opposite end of the first pushing member and the opposite end of the second pushing member along a direction that is perpendicular to a direction in which the first pushing member and the second pushing member are arranged, when viewed from the top, a first crank member having a guide groove, a lengthwise direction of which is provided in a direction that is perpendicular to a movement direction of the piston when viewed from the top and one end of which is connected to the piston, a first connecting shaft, one end of which is moved along the guide groove and an opposite end of which is connected to the opposite end of the first pushing member, a second connecting shaft, one end of which is moved along the guide groove and an opposite end of which is connected to the opposite end of the second pushing member, and an air supply/discharge part configured to supply and discharge air to and from the first air cylinder.

The pushing member may further include a third pushing member and a fourth pushing member that are adjacent to each other such that the opposite ends of the third pushing member and the fourth pushing member face each other, the rotation driving unit may include a second air cylinder configured to linear move the piston toward a space between the opposite end of the third pushing member and the opposite end of the fourth pushing member along a direction that is perpendicular to a direction in which the third pushing member and the fourth pushing member are arranged, when viewed from the top, a second crank member having a guide groove, a lengthwise direction of which is provided in a direction that is perpendicular to a movement direction of the piston of the second air cylinder when viewed from the top and one end of which is connected to the piston, a third connecting shaft, one end of which is moved along the guide groove of the second crank member and an opposite end of which is connected to the opposite end of the third pushing member, and a fourth connecting shaft, one end of which is moved along the guide groove of the second crank member and an opposite end of which is connected to the opposite end of the fourth pushing member, and the air supply/discharge part may supply and discharge air to and from the first air cylinder and the second air cylinder such that the first pushing member, the second pushing member, the third pushing member, and the fourth pushing member are moved between the first location and the second location in the same direction.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Figure 1:
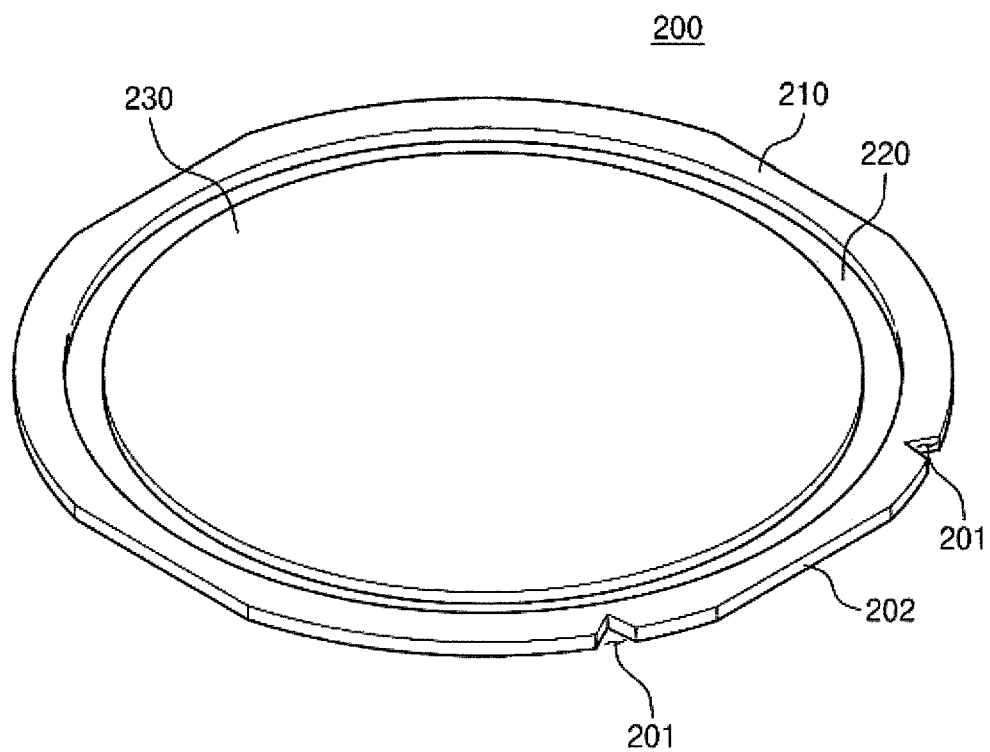
FIG. 1 is a perspective view illustrating an example of a treatment object that is aligned by an alignment apparatus of the inventive concept.

FIG. 1 is a perspective view illustrating an example of a treatment object 200 that is aligned by an alignment apparatus 100 of the inventive concept. Referring to FIG. 1, the alignment apparatus 100 according to an embodiment of the inventive concept is an apparatus that aligns a treatment object 200. The treatment object 200 has a notch 201 that is recessed inwards from a side surface thereof in a peripheral area thereof. According to an embodiment, the treatment object 200 includes a frame ring 210, a mounting tape 220, and a substrate 230. As illustrated in FIG. 1, the substrate 230 is attached to an upper surface of the mounting tape 220 that is fixed to an inner surface of the frame ring 210. The substrate 230 may be a semiconductor wafer. The frame ring 210 has a ring shape, a radius of which is larger than that of the substrate 230. The frame ring 210 may be formed of stainless steel. The mounting tape 220 is a thin film, and is fixed to the frame ring 210 because the film itself cannot easily support the substrate 230. Because the frame ring 210 has a radius that is larger than that of the substrate 230, the mounting tape 220 is exposed to the outside in an area between the frame ring 210 and the substrate 230 when viewed from the top.

Figure 2:
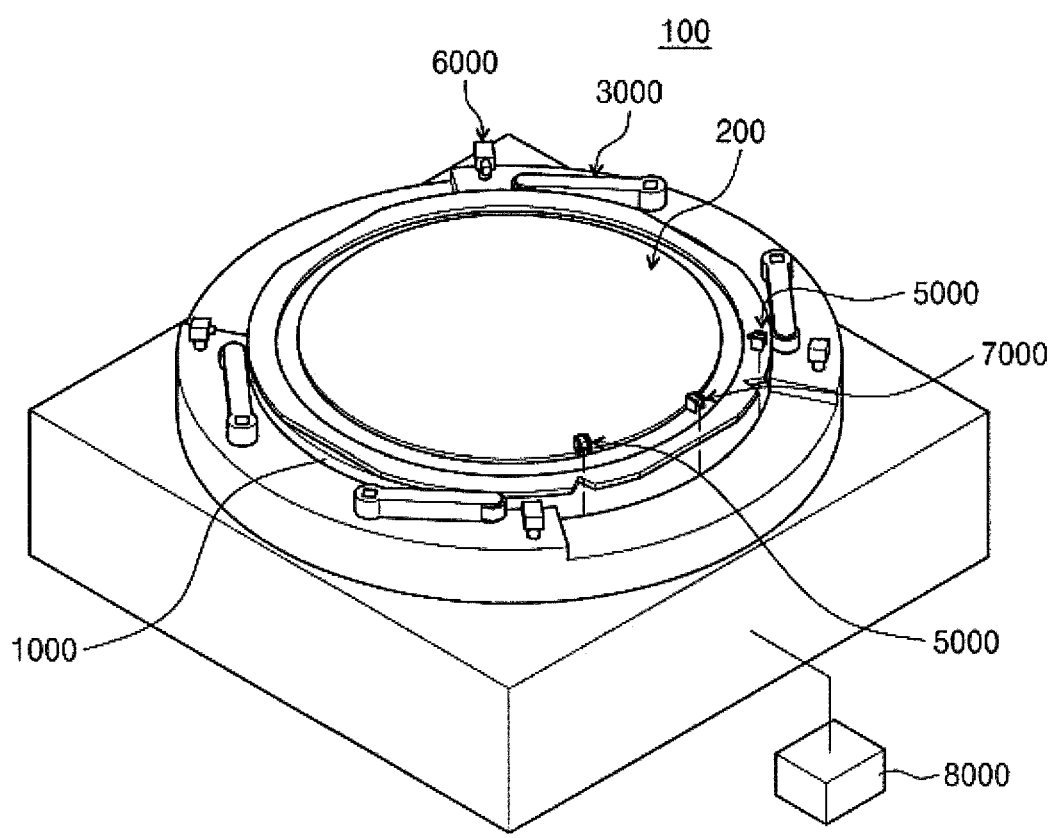
FIG. 2 is a perspective view illustrating an alignment apparatus according to an embodiment of the inventive concept.
Figure 3:
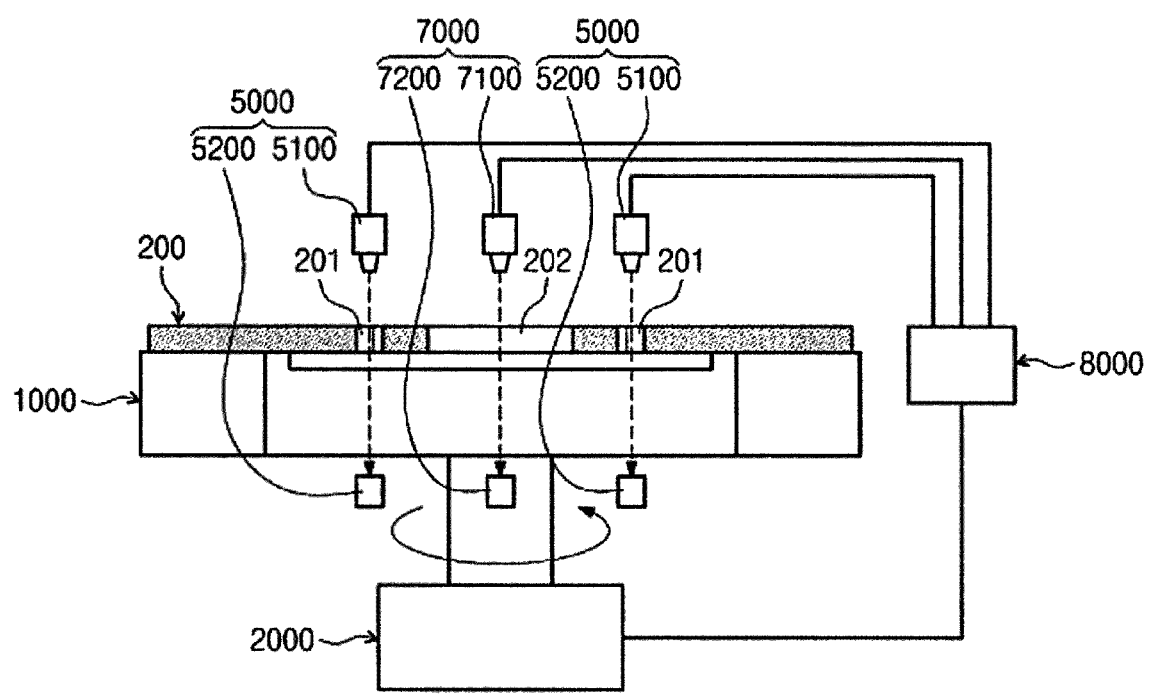
FIG. 3 is a view schematically illustrating a support member, a driving unit, a notch detecting unit, and an edge detecting unit of FIG. 2.

FIG. 2 is a perspective view illustrating an alignment apparatus 100 according to an embodiment of the inventive concept. FIG. 3 is a view schematically illustrating a support member 1000, a driving unit 2000, a notch detecting unit 5000, and an edge detecting unit 7000 of FIG. 2; Referring to FIGS. 2 and 3, according to an embodiment, the alignment apparatus 100 includes a support member 1000, a driving unit 2000, pushing members 3000, a rotation driving unit 4000, a notch detecting unit 5000, a height detecting unit 6000, an edge detecting unit 7000, and a controller 8000.

Figure 4:
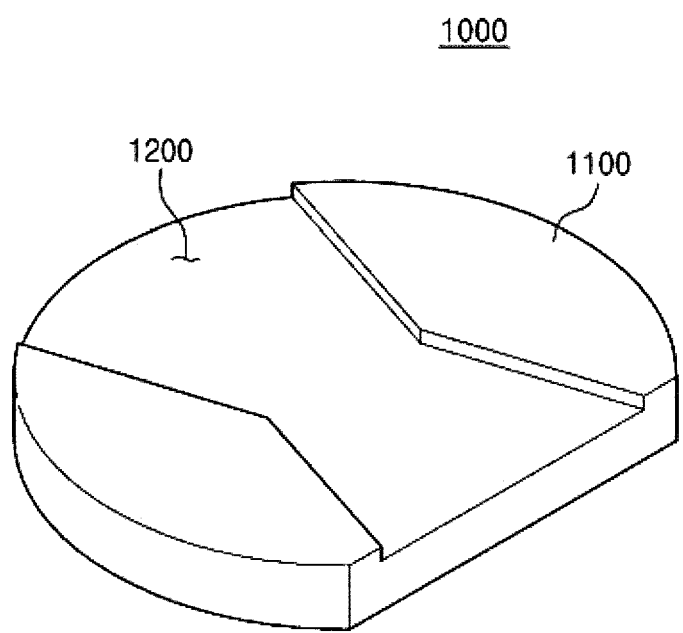
FIG. 4 is a perspective view illustrating a support member of FIG. 1.

FIG. 4 is a perspective view illustrating a support member 1000 of FIG. 1. Referring to FIGS. 2 to 4, the treatment object 200 is positioned on the support member 1000. The support member 1000 is provided such that a laser beam of a laser sensor of the notch detecting unit 5000, which will be described below, may pass through a notch 201 upwards and downwards, and a laser beam of a laser sensor of the edge detecting unit 7000 may pass by a specific location that is spaced apart from an edge 202 by a specific distance. According to an embodiment, one of a light emitting unit 5100 and 7100 and a light receiving unit 5200 and 7200 of the notch detecting unit 5000 and the edge detecting unit 7000 may be provided above the support member 1000 and the other one of the light emitting unit 5100 and 7100 and the light receiving unit 5200 and 7200 may be provided below the support member 1000, and the support member 1000 may have a shape in which areas thereof corresponding to the notch 201 and the edge 202 are cut away. The locations and the number of cutaway areas of the support member 1000 may be determined differently according to the locations and the number of the notches 201 and the locations and the number of the edges 202. The support member 1000 is rotated by the driving unit 2000. Unlike this, the diameter of the support member 1000 in all directions is shorter than the shortest diameters of the treatment object 200 at the notches 201 and the edges 202, the cutaway areas may not be provided. Further, a partial area 1200 of the upper surface of the support member 1000 may be recessed downwards such that a hand of a transfer unit that transfers the treatment object 200 may be moved. In this case, the treatment object 200 is supported by an area 1100, except for the recessed area 1200 of the upper surface of the support member 1000.

Figure 5:
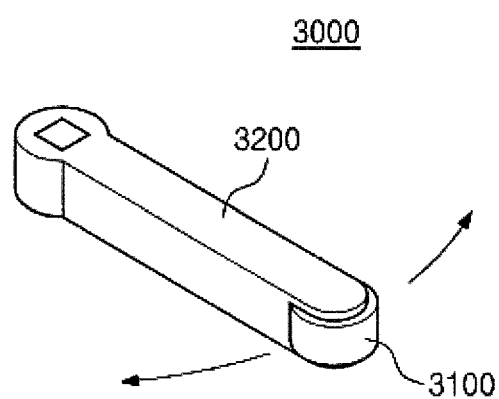
FIG. 5 is a perspective view illustrating a pushing member of FIG. 2.
Figure 6:
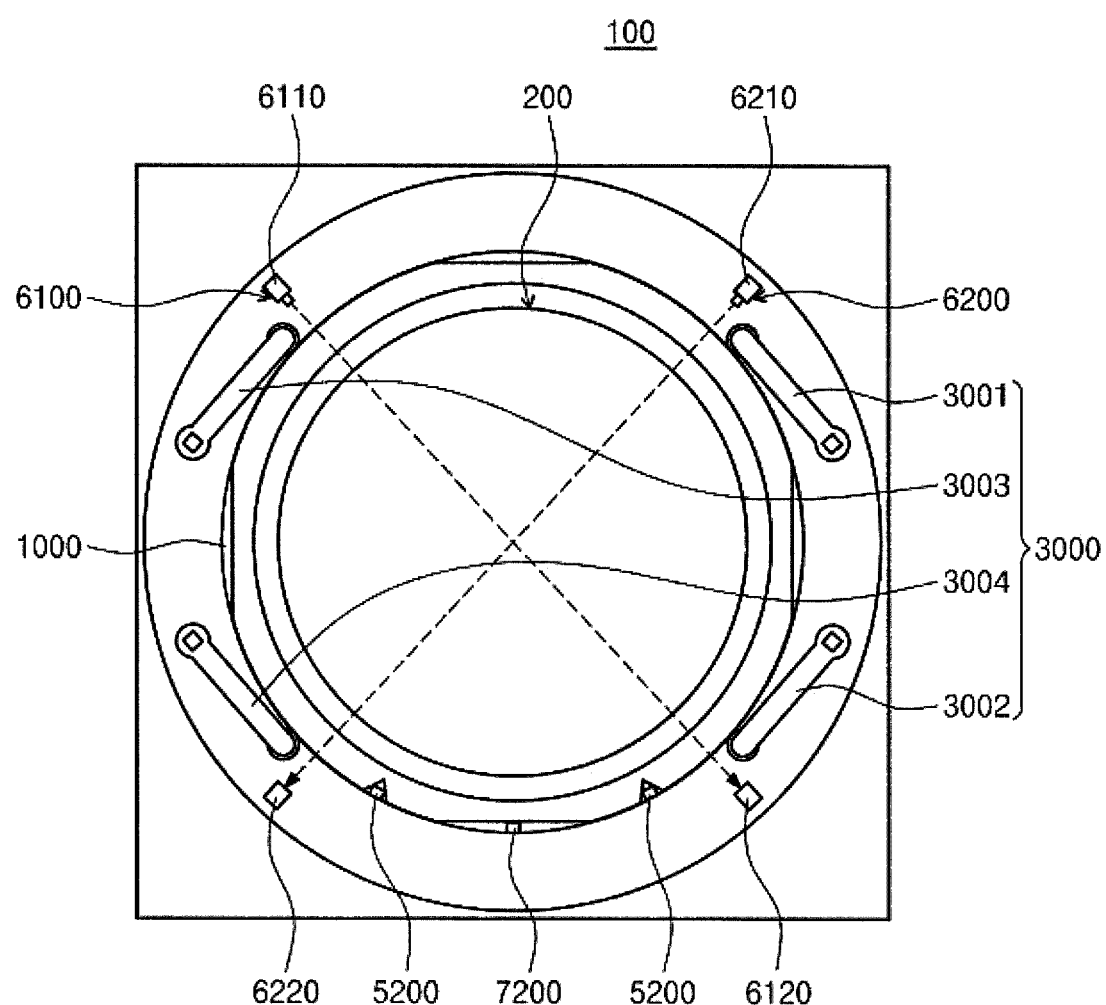
FIG. 6 is a plan view illustrating that the pushing members of FIG. 2 are located at a first location.
Figure 7:
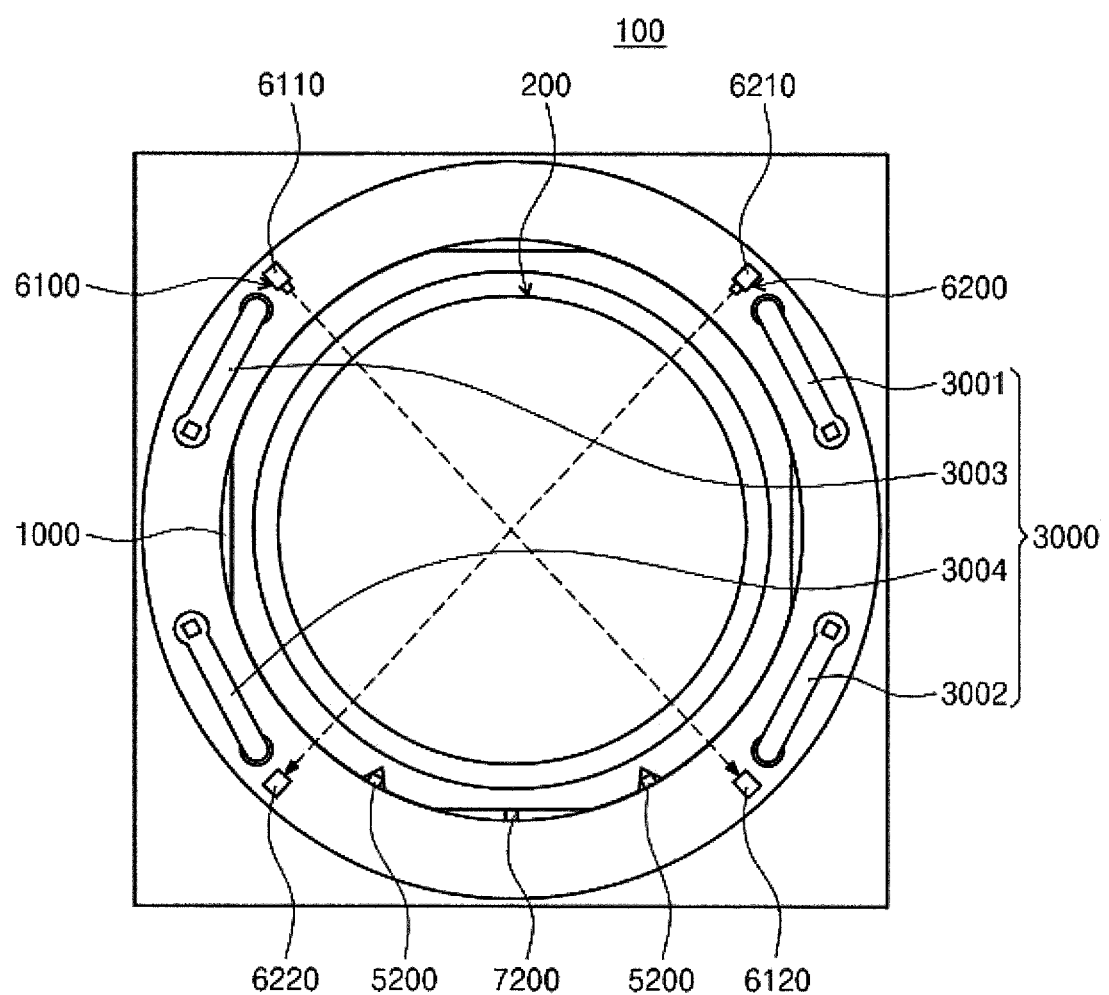
FIG. 7 is a plan view illustrating that the pushing members of FIG. 2 are located at a second location.

FIG. 5 is a perspective view illustrating a pushing member 3000 of FIG. 2. FIG. 6 is a plan view illustrating that the pushing members 3000 of FIG. 2 are located at a first location. FIG. 7 is a plan view illustrating that the pushing members 3000 of FIG. 2 are located at a second-location. Referring to FIGS. 5 to 7, the pushing member 3000 moves the treatment object 200 to a proper location on the support member 1000 by applying a force to a side surface of the treatment object 200 positioned on the support member 1000. According to an embodiment, the pushing member 3000 includes a rotary member 3100 and a rotation support part 3200.

The rotary member 3100 has a rotational body shape, an upward/downward direction of which is a rotary shaft and which is rotatable about the rotary shaft. According to an embodiment, the rotary member 3100 has a cylindrical shape, a lengthwise direction of which is an upward/downward direction. The rotary member 3100 may be movable between a first location and a second location. The first location is a location at which a side surface of the rotary member 3100 contacts a side surface of the treatment object 200 that is properly located on the support member 1000. The second location is a location at which a side surface of the rotary member 3100 is spaced apart from a side surface of the treatment object 200 that is properly located on the support member 1000 by a specific distance.

The rotary member 3100 is coupled to one end of the rotation support part 3200 to be rotatable and the rotary member 3100 is provided to be moved between the first location and the second location to be rotatable about an opposite end of the rotary member 3100 along a horizontal direction.

That is, when the rotary member 3100 is located at the second location, a space for easily positioning the treatment object 200 on the support member 1000 may be secured. Further, as the rotary member 3100 is moved from the second location to the first location after the treatment object 200 is positioned on the support member 1000, the treatment object 200 that deviated from a proper location on the support member 1000 may be moved to the proper location.

A plurality of pushing members 3000 are spaced apart from each other and are provided to surround the support member 1000. According to an embodiment, the pushing member 3000 includes a first pushing member 3001, a second pushing member 3002, a third pushing member 3003, and a fourth pushing member 3004. Opposite ends of the first pushing member 3001 and the second pushing member 3002, which act as rotary shafts, are provided adjacently to each other to face each other. Opposite ends of the third pushing member 3003 and the fourth pushing member 3004, which act as rotary shafts, are provided adjacently to each other to face each other. The first pushing member 3001 and the second pushing member 3002, and the third pushing member 303 and the fourth pushing member 3004 may be symmetrical to each other while the support member 1000 is interposed therebetween. Unlike this, various numbers of pushing members 3000 may be provided if necessary.

Figure 8:
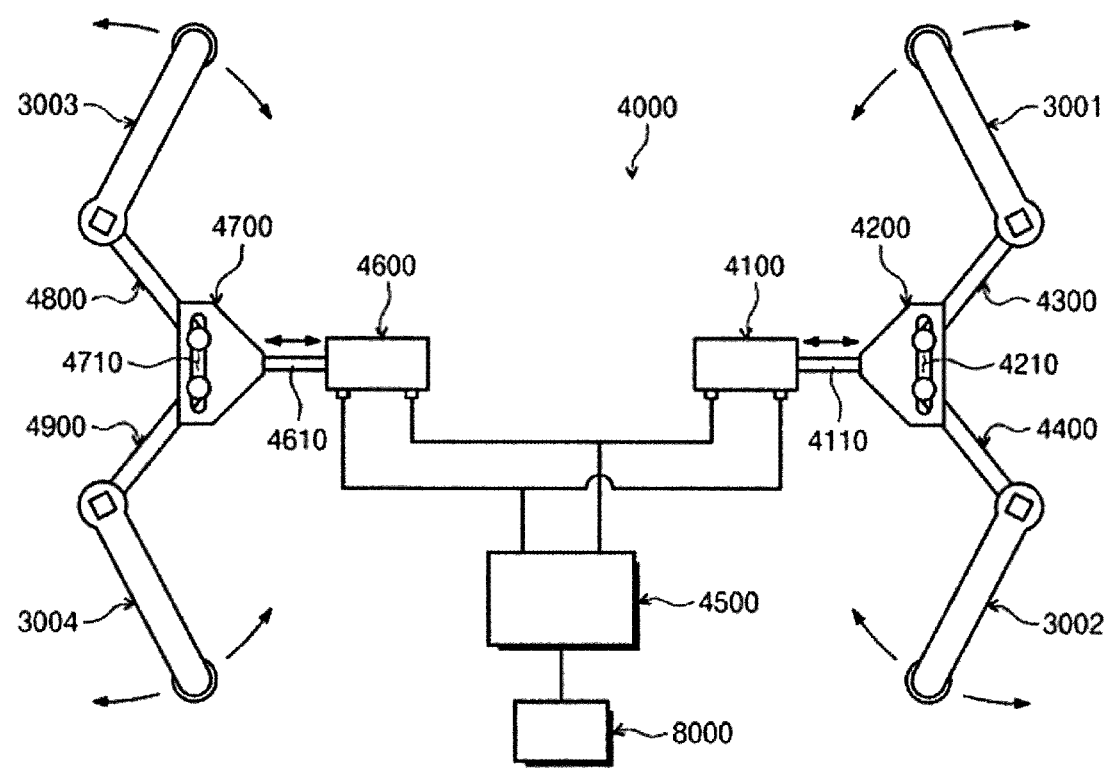
FIG. 8 is a view schematically illustrating an example of the pushing members of FIG. 2 and a rotation driving unit that rotates the pushing members.

FIG. 8 is a view schematically illustrating an example of the pushing members 3000 of FIG. 2 and a rotation driving unit 2000 that rotates the pushing members. Referring to FIG. 8, the rotation driving unit 2000 rotates the pushing members 3000. According to an embodiment, the rotation driving unit 2000 includes a first air cylinder 4100, a first crank member 4200, a first connecting shaft 4300, a second connecting shaft 4400, and an air supply/discharge part 4500.

The first air cylinder 4100 is provided such that the piston 4110 is linearly moved to a space between the opposite end of the first pushing member 3001, which acts as a rotary shaft, and the opposite end of the second pushing member 3002, which acts as a rotary shaft, along a direction that is perpendicular to a direction in which the first pushing member 3001 and the second pushing member 3002 are arranged, when viewed from the top.

The first crank member 4200 has a guide groove 4210 provided such that a lengthwise direction thereof is perpendicular to a movement direction of the piston 4110 of the first air cylinder 4100 when viewed from the top, and one end of the first crank member 4200 is connected to the piston 4110 of the first air cylinder 4100.

One end of the first connecting shaft 4300 is moved along the guide grove 4210 of the first crank member 4200, and an opposite end of the first connecting shaft 4300 is connected to the opposite end of the first pushing member 3001, which acts as a rotary shaft.

One end of the second connecting shaft 4400 is moved along the guide grove 4210 of the first crank member 4200, and an opposite end of the second connecting shaft 4400 is connected to the opposite end of the second pushing member 3002, which acts as a rotary shaft.

The air supply/discharge part 4500 supplies and discharges air to the first air cylinder 4100. The piston 4110 of the first air cylinder 4100 is linearly moved through the supply and discharge of the air by the air supply/discharge part 4500.

As described above, if the first crank member 4200 is linearly moved due to the linear movement of the piston 4110, the first connecting shaft 4300 and the second connecting shaft 4400 are rotated while opposite ends of the first connecting shaft 4300 and the second connecting shaft 4400 are moved along the guide grooves 4210, and accordingly, the first pushing member 3001 and the second pushing member 3002 are rotated between the first location and the second location.

According to an embodiment, the rotation driving unit 2000 includes a second air cylinder 4600, a second crank member 4700, a third connecting shaft 4800, and a fourth connecting shaft 4900.

The second air cylinder 4600 is provided such that the piston 4610 is linearly moved to a space between the opposite end of the third pushing member 3003, which acts as a rotary shaft, and the opposite end of the fourth pushing member 3004, which acts as a rotary shaft, along a direction that is perpendicular to a direction in which the third pushing member 3003 and the fourth pushing member 3004 are arranged, when viewed from the top.

The second crank member 4700 has a guide groove 4710 provided such that a lengthwise direction thereof is perpendicular to a movement direction of the piston 4610 of the second air cylinder 4600 when viewed from the top, and one end of the second crank member 4700 is connected to the piston 4610 of the second air cylinder 4600.

One end of the third connecting shaft 4800 is moved along the guide grove 4710 of the second crank member 4700, and an opposite end of the third connecting shaft 4800 is connected to the opposite end of the second pushing member 3003, which acts as a rotary shaft.

One end of the fourth connecting shaft 4900 is moved along the guide grove 4710 of the second crank member 4700, and an opposite end of the fourth connecting shaft 4900 is connected to the opposite end of the second pushing member 3004, which acts as a rotary shaft.

The air supply/discharge part 4500 supplies and discharges air to the first air cylinder and the second air cylinder such that the first pushing member 3001, the second pushing member 3002, the third pushing member 3003, and the fourth pushing member 3004 are moved in the same direction between the first location and the second location. According to an embodiment, the air supply/discharge part 4500 supplies and discharges air to the first air cylinder 4100 and the second air cylinder 4600 such that the piston 4100 of the first air cylinder 4100 and the piston 4610 of the second air cylinder 4600 are moved inwards and outwards at the same time. According to an embodiment, the air supply/discharge part 4500 may determine supply and discharge of air under the control of the controller 8000.

As described above, because the pressure of the fluid is constant regardless of the locations in one closed container, the same force is applied to the first pushing member 3001, the second pushing member 3002, the third pushing member 3003, and the fourth pushing member 3004 through the supply and discharge of air by the air supply/discharge part 4500 at the same time, and accordingly, the treatment object 200 may be prevented from deviating from the support member 1000 due to an unbalance of the forces applied to the treatment object 200 by the first pushing member 3001, the second pushing member 3002, the third pushing member 3003, and the fourth pushing member 3004. In particular, unlike the case that will be described below, because some of the first pushing member 3001, the second pushing member 3002, the third pushing member 3003, and the fourth pushing member 3004 may be moved excessively towards the center of the support member 1000 if the forces of the first pushing member 3001, the second pushing member 3002, the third pushing member 3003, and the fourth pushing member 3004 are unbalanced when the diameter of the support member 1000 is smaller than the diameter of the treatment object 200, there is a high possibility of the treatment object 200 deviating from the support member 1000.

Unlike this, the diameter of the support member 1000, except for the above-described cutaway areas, may be the same as the diameter of the treatment object 200, except for the areas in which the notches 201 and the edges 202 are provided, the lower area of the rotary member 3100 faces a side surface of the support member 1000, and the upper area of the rotary member 3100 faces a side surface of the treatment object 200. In this case, because the rotary members 3100 cannot move toward the center of the support member 1000 from a location at which the side surfaces of the rotary members 3100 contact a side surface of the support member 1000, the treatment object 200 may be prevented from deviating from the support member 1000 due to excessive movements of the first pushing member 3001, the second pushing member 3002, the third pushing member 3003, and the fourth pushing member 3004 or an unbalance of forces.

Unlike the above-described one, the rotation driving unit 2000 may have various configurations and structures that may move the pushing members 3000 between the first location and the second location according to the number and arrangement forms of the pushing members 3000.

Referring to FIGS. 6 and 7 again, the notch detecting unit 5000 detects whether the notches 201 of the treatment object 200 are located at specific locations. According to an embodiment, a plurality of notches 201 are provided along a circumference of the frame ring 210. A plurality of notch detecting units 5000 are provided to correspond to the notches. For example, the notch detecting units 5000 may be laser sensors, laser beams of which passes through the notches upwards and downwards, respectively. In this case, when the laser beams emitted from the light emitting units 5100 of the notch detecting units 5000 reach the light receiving units, it is determined that the treatment object 200 is located at a proper location, and when the laser beams emitted from the light emitting units 5100 of the notch detecting units 5000 do not reach the light receiving units, it is determined that the treatment object 200 deviates from the proper location.

The height detecting unit 6000 detects whether a partial area of the treatment object 200 is located at a specific height or more from the upper surface of the support member 1000. According to an embodiment, the height detecting unit 6000 includes laser sensors 6100 and 6200. Each of the laser sensors 6100 and 6200 includes a light emitting unit 6110 and 6210 and a light receiving unit 6120 and 6220.

The light emitting unit 6110 and 6210 emits a laser beam. The light receiving unit 6120 and 6220 receives the laser beam emitted from the light emitting unit 6110 and 6210. The light emitting unit 6110 and 6210 and the light receiving unit 6120 and 6220 are provided on opposite sides of the support member 1000. According to an embodiment, the laser sensors 6100 and 6200 include a first laser sensor 6100 and a second laser sensor 6200. When viewed from the top, the first laser sensor 6100 and the second laser sensor 6200 are provided such that the laser beams emitting from the light emitting units 6110 and 6210 cross each other on the support member.

Figure 9:
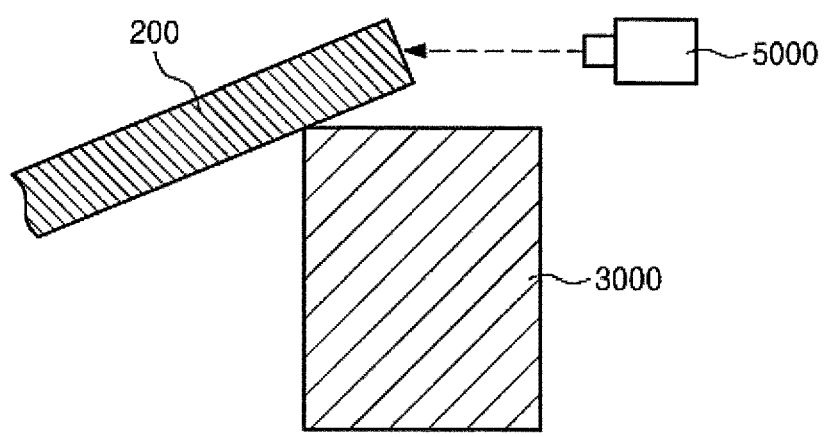
FIG. 9 is a view illustrating an example in which a height detecting unit detects a treatment object when the treatment object is laid on an upper side of one of the pushing members of FIG. 2.

FIG. 9 is a view illustrating an example in which a height detecting unit 6000 detects a treatment object 200 when the treatment object 200 is laid on an upper side of one of the pushing members 3000 of FIG. 2. Referring to FIG. 9, the light emitting units 6110 and 6210 irradiate a laser beam such that the laser beam passes by a height that is higher than the upper end of the pushing member 3000 by a specific value or more. Accordingly, if the treatment object 200 excessively deviates from a proper location and one side of the treatment object 200 is laid on an upper end of the pushing member 3000 when the treatment object 200 is positioned on the support member 1000, deviation of the location of the treatment object 200 may be detected because the laser beam of the pushing member 3000 interferes with the one side of the treatment object 200.

Referring to FIGS. 1 to 3, according to an embodiment, an edge 202 having a cutaway side such that the edge 202 is linear when viewed from the top may be formed on a side surface of the frame ring 210. The edge detecting unit 7000 detects whether the edge 202 is located at a specific location. For example, the edge detecting unit 7000 may be a laser sensor that is provided such that a laser beam passes by a specific location that is spaced apart from the edge 202 by less than a specific distance. The edge detecting unit 7000 may include a light emitting unit 7100 that emitting a laser beam and a light receiving unit 7200 that receives the laser beam emitted from the light emitting unit 7100. In this case, the scheme of detecting a location of the edge by the edge detecting unit 7000 is the same as the scheme of detecting a notch 201 by the notch detecting unit 5000.

According to an embodiment, two notches 201 may be provided to be spaced apart from each other, and an edge 202 may be provided between the notches 201. Unlike this, the edge 202 may be provided at another location on the outside of the treatment object 200.

Because the edge 202 and the edge detecting unit 7000 are provided in addition to the notch 201 and the notching detecting unit 5000, the location of the treatment object 200 may be detected in a multiple way. Accordingly, it may be detected stably and precisely whether the treatment object 200 is located at a proper location.

The controller 8000 controls the driving unit 2000 to rotate the support member 1000 such that the notch 201 of the treatment object 200 is located at a specific location of the notch 201. According to an embodiment, the controller 8000 controls the driving unit 2000 to rotate the rotation member 1000 in a state in which the pushing member 3000 is located at a first location such that the notch 201 of the treatment object is located at a specific location. According to an embodiment, the alignment apparatus 100 may further include an alarm member (not illustrated) or a display unit (not illustrated). The controller 8000 may control the alarm member to generate an alarm or control the display unit to output a warning image when it is detected by the height detecting unit 6000 that the treatment object 200 deviates from a proper location.

According to an embodiment, the controller 8000 rotates the support member 1000 such that the treatment object 200 is rotated to a location at which it is detected that the notch 201 and the edge 202 are located at proper locations in a state in which the pushing member 3000 is located at a first location when the notch detecting unit 5000 and the edge detecting unit 7000 detect that the locations of the notch 201 and the edge 202 deviate from their proper locations. Because a side surface of the treatment object 200 is supported by the pushing member 3000 when the treatment object 200 is aligned by rotating the support member 1000, the treatment object 200 may be aligned more stably.

According to an embodiment, when two notches 201 are provided as illustrated in FIG. 1, the controller 8000 may determine a direction of rotation according to through which of the two notches 201 a laser beam passes as the notch detecting unit 5000 irradiates a laser beam such that the laser beam is closer to one of the inner surfaces of the notch 210, which is closer to the edge 202, or is closer to one of the inner surfaces of the notch 210, which is farther from the edge 202.

The align apparatus according to an embodiment of the inventive concept may align a treatment object precisely.

The align apparatus according to an embodiment of the inventive concept may align a treatment object stably.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. An alignment apparatus for align a treatment object having a notch, the alignment apparatus comprising:
   a support member on which the treatment object is positioned;
   a driving unit configured to rotate the support member;
   a pushing member configured to move the treatment object to a proper location on the support member by applying a force to a side surface of the treatment object positioned on the support member;
   a notch detecting unit configured to detect whether the notch of the treatment object is located at a specific location;
   a controller configured to control the driving unit such that the notch of the treatment object is located at the specific location by rotating the support member; and
   a rotation driving unit configured to rotate the pushing member,
   wherein the pushing member includes:
      a rotary member provided to be movable between a first location and a second location and having a rotational body shape that is rotatable about a vertical rotary shaft; and
      a rotation support part, to one end of which the rotary member is coupled and which is provided to be rotatable about an opposite end thereof along a horizontal direction,
   wherein the first location is a location at which a side surface of the rotary member contacts a side surface of the treatment object located at a proper location on the support member, and the second location is a location at which a side surface of the rotary member is spaced apart from a side surface of the treatment object located at a proper location on the support member by a specific distance,
   wherein the pushing member includes:
      a first pushing member and a second pushing member that are adjacent to each other such that the opposite ends of the first pushing member and the second pushing member face each other,
   wherein the rotation driving unit includes:
      a first air cylinder configured to linear move a piston toward a space between the opposite end of the first pushing member and the opposite end of the second pushing member along a direction that is perpendicular to a direction in which the first pushing member and the second pushing member are arranged, when viewed from the top;
      a first crank member having a guide groove, a lengthwise direction of which is provided in a direction that is perpendicular to a movement direction of the piston when viewed from the top and one end of which is connected to the piston;
      a first connecting shaft, one end of which is moved along the guide groove and an opposite end of which is connected to the opposite end of the first pushing member;
      a second connecting shaft, one end of which is moved along the guide groove and an opposite end of which is connected to the opposite end of the second pushing member; and
      an air supply/discharge part configured to supply and discharge air to and from the first air cylinder.

2. The alignment apparatus of claim 1, wherein a plurality of pushing members are spaced apart from each other to surround the support member.

3. The alignment apparatus of claim 2, wherein the controller controls the driving unit such that the notch of the treatment object is located at the specific location by rotating the support member in a state in which the pushing member is located at the first location.

4. The alignment apparatus of claim 3, wherein the treatment object includes:
a frame ring;
a mounting tape fixed to an inner surface of the frame ring; and
a wafer attached to an upper surface of the mounting tape.

5. The alignment apparatus of claim 2, wherein the treatment object includes:
a frame ring;
a mounting tape fixed to an inner surface of the frame ring; and
a wafer attached to an upper surface of the mounting tape.

6. The alignment apparatus of claim 1, further comprising:
a height detecting unit configured to detect whether a partial area of the treatment object is located at a height or more from an upper surface of the support member.

7. The alignment apparatus of claim 6, wherein the height detecting unit includes:
a laser sensor,
wherein the laser sensor includes:
a light emitting unit configured to emit a laser beam; and
a light receiving unit configured to receive the laser beam emitted from the light emitting unit,
wherein the light emitting unit and the light receiving unit are provided on opposite sides of the support member.

8. The alignment apparatus of claim 7, wherein the laser sensor includes:
a first laser sensor and a second laser sensor provided such that the laser beams emitted from the light emitting units cross each other on the support member, when viewed from the top.

9. The alignment apparatus of claim 6, wherein the treatment object includes:
a frame ring;
a mounting tape fixed to an inner surface of the frame ring; and
a wafer attached to an upper surface of the mounting tape.

10. The alignment apparatus of claim 1, wherein the treatment object includes:
a frame ring;
a mounting tape fixed to an inner surface of the frame ring; and
a wafer attached to an upper surface of the mounting tape.

11. The alignment apparatus of claim 1, wherein a plurality of notches are provided along a circumference of the treatment object,
wherein the notch detecting units are provided to correspond to the notches.

12. The alignment apparatus of claim 11, wherein the notch detecting unit is a laser sensor provided such that a laser beam passes through the notch upwards and downwards.

13. The alignment apparatus of claim 11, wherein an edge that is cutaway such that the gap between the notches is linear when viewed from the top is formed on a side surface of the frame ring, when viewed from the top, and
wherein the alignment apparatus further comprises an edge detecting unit configured to detect whether the edge is located at a specific location.

14. The alignment apparatus of claim 13, wherein the edge detecting unit is a laser sensor provided such that a laser beam passes by a specific location that is spaced apart from the edge by less than a specific distance.

15. The alignment apparatus of claim 1, wherein the pushing member further includes:
a third pushing member and a fourth pushing member that are adjacent to each other such that the opposite ends of the third pushing member and the fourth pushing member face each other,
wherein the rotation driving unit further includes:
a second air cylinder configured to linear move the piston toward a space between the opposite end of the third pushing member and the opposite end of the fourth pushing member along a direction that is perpendicular to a direction in which the third pushing member and the fourth pushing member are arranged, when viewed from the top;
a second crank member having a guide groove, a lengthwise direction of which is provided in a direction that is perpendicular to a movement direction of the piston of the second air cylinder when viewed from the top and one end of which is connected to the piston;
a third connecting shaft, one end of which is moved along the guide groove of the second crank member and an opposite end of which is connected to the opposite end of the third pushing member; and
a fourth connecting shaft, one end of which is moved along the guide groove of the second crank member and an opposite end of which is connected to the opposite end of the fourth pushing member,
wherein the air supply/discharge part supplies and discharges air to and from the first air cylinder and the second air cylinder such that the first pushing member, the second pushing member, the third pushing member, and the fourth pushing member are moved between the first location and the second location in the same direction.

* * * * *